United States Patent
Veihl et al.

(10) Patent No.: US 9,325,065 B2
(45) Date of Patent: Apr. 26, 2016

(54) SHARED ANTENNA ARRAYS WITH MULTIPLE INDEPENDENT TILT

(71) Applicant: CommScope Technologies LLC, Hickory, NC (US)

(72) Inventors: Jonathon C. Veihl, New Lenox, IL (US); Martin L. Zimmerman, Chicago, IL (US); GuoLong Xu, Jiangsu (CN); Zhongcao Yang, Jiangsu (CN)

(73) Assignee: CommScope Technologies LLC, Hickory, NC (US)

( * ) Notice: Subject to any disclaimer, the term of this patent is extended or adjusted under 35 U.S.C. 154(b) by 340 days.

(21) Appl. No.: 13/771,474

(22) Filed: Feb. 20, 2013

(65) Prior Publication Data
US 2013/0214973 A1    Aug. 22, 2013

Related U.S. Application Data

(60) Provisional application No. 61/600,949, filed on Feb. 20, 2012, provisional application No. 61/601,887, filed on Feb. 22, 2012, provisional application No. 61/612,137, filed on Mar. 16, 2012.

(51) Int. Cl.
*H01Q 3/40* (2006.01)
*H03H 7/46* (2006.01)
*H01Q 1/24* (2006.01)

(52) U.S. Cl.
CPC ............... *H01Q 3/40* (2013.01); *H01Q 1/246* (2013.01); *H03H 7/461* (2013.01)

(58) Field of Classification Search
CPC .......... H01Q 3/26; H01Q 3/2605; H01Q 3/36
USPC ........... 342/154, 368, 372, 373; 343/850, 853
See application file for complete search history.

(56) References Cited

U.S. PATENT DOCUMENTS

| 4,799,065 A | 1/1989 | Thompson |
| 6,850,130 B1 | 2/2005 | Gottl et al. |
| 6,864,837 B2 | 3/2005 | Runyon |

FOREIGN PATENT DOCUMENTS

WO    WO 01/13459    2/2001

OTHER PUBLICATIONS

European Search Report for related EP Patent Application No. EP 13 15 5850 dated Jun. 12, 2013.
Report on Sep. 21, 2015 of phone conference regarding Oral Proceedings on Oct. 6, 2015 in EPO, to Modiano & Partners (DE), (4 pages).

(Continued)

*Primary Examiner* — Dao Phan
(74) *Attorney, Agent, or Firm* — Myers Bigel & Sibley, P.A.

(57) ABSTRACT

A feed network for use with an antenna array includes at least first and second RF inputs, a combiner network and a beamforming network. In some examples, additional RF inputs are provided. Each RF input corresponds to a sub-band. The first RF input for a first sub-band signal is coupled to a first sub-band parameter control; the second RF input for the second sub-band signal is coupled to a second sub-band parameter control. The combiner network is coupled to the first sub-band parameter control and to the second sub-band parameter control. The combiner network also has at least one output comprising a combination of the first sub-band signal and the second sub-band signal. The beamforming network is coupled to the combiner network and has a plurality of RF outputs. The first and second sub-band parameter controls are independently adjustable. In one example, the beamforming network comprises a Butler matrix.

17 Claims, 10 Drawing Sheets

(56) References Cited

OTHER PUBLICATIONS

Summons to Oral Proceedings Apr. 28, 2015, to Modiano & Partners (DE) to be held at EPO in Rijswijk, Netherlands on Oct. 6, 2015, (12 pages).

Applicant's Response to EPO, Report of Jun. 12, 2014 communication, sent on Oct. 20, 2014, (9 pages).

EPO Examination Report of Jun. 12, 2014 to Modiano & Partners (DE), (7 pages).

Response to Examination Report of Jun. 12, 2013 by Modiano & Partners, sent Feb. 21, 2014, (9 pages).

SHARED ANTENNA ARRAYS WITH MULTIPLE INDEPENDENT TILT

CROSS-REFERENCE TO RELATED APPLICATIONS

This application claims priority to U.S. Patent App. Ser. No. 61/600,949, U.S. Patent App. Ser. No. 61/601,887 and U.S. Patent App. Ser. No. 61/612,137, each titled Shared Antenna Arrays With Multiple Independent Tilt, the disclosures of which are incorporated by reference.

BACKGROUND

Antennas for wireless voice and/or data communications typically include an array of radiating elements connected by one or more feed networks. Many base station antennas include a plurality of radiating elements in a linear array. Various attributes of the antenna array, such as beam elevation angle, beam azimuth angle, and half power beam width may be adjusted by electrical-mechanical controllers. See, for example, U.S. Pat. Nos. 6,573,875 and 6,603,436, both of which are incorporated by reference.

For example, with respect to U.S. Pat. No. 6,573,875, a plurality of radiating elements may be provided in an approximately vertical alignment. A feed network may be provided to supply each of the radiating elements with a signal. The phase angle of the signals provided to the radiating elements may be adjusted to cause a radiated beam angle produced by the antenna array to tilt up or down from a nominal or default beam angle. The phase angles may be adjusted by operating electromechanical components, such as phase shifter. Phase shifters may be employed to adjust beam downtilt and/or beam azimuth angle, and/or to adjust power division, and thereby adjust beam width. In one example, phase shifters may be coupled to an actuator, allowing remote control of the adjustment of the phase shifter.

Another example of electrical downtilt control involves a phase shifting technique called "power shifting." An example of this is provided in U.S. Pat. No. 6,864,837, which is incorporated by reference. Briefly, an RF signal is applied to a variable power divider, which is then applied to a Butler matrix. The output of the Butler matrix has four ports having different phase angles depending, which, when applied to radiating elements, steer an output beam of the antenna array up or down.

Multiband antennas are also known. A conventional multiband antenna may include different radiating elements for each of the bands. See, for example, U.S. Pat. No. 6,295,028, U.S. Pat. No. 6,333,720, U.S. Pat. No. 7,238,101 and U.S. Pat. No. 7,405,710, the disclosures of which are incorporated by reference. Each set of radiating elements typically has its own feed network.

SUMMARY

The present disclosure relates to achieving multiple sub-band performance on a given antenna array, where each of the sub-bands has an independently controlled characteristic, such as down-tilt. Additionally, alternate embodiments include examples where some aspects of beam steering are applied to all sub-bands, and other aspects of beam steering are applied independently to sub-bands. These advantageous features are not taught or suggested in the patents identified above.

A feed network for use with an antenna array includes at least first and second RF inputs, a combiner network and a beamforming network. In some examples, additional RF inputs are provided. Each RF input corresponds to a sub-band. The first RF input for a first sub-band signal is coupled to a first sub-band parameter control; the second RF input for the second sub-band signal is coupled to a second sub-band parameter control. The combiner network is coupled to the first sub-band parameter control and to the second sub-band parameter control. The combiner network also has at least one output comprising a combination of the first sub-band signal and the second sub-band signal. The beamforming network is coupled to the combiner network and has a plurality of RF outputs. The first and second sub-band parameter controls are independently adjustable. In one example, the beamforming network comprises a Butler matrix.

In one example, the sub-band parameter controls comprise differential phase shifters. Adjusting a first differential phase shifter results in the first RF sub-band to have a first set of phase relationships on the plurality of RF outputs, and adjusting a second differential phase shifter results in the second RF sub-band to have a second set of phase relationships on the plurality of RF outputs.

In one example, the combiner network comprises a first branchline hybrid coupled to the first phase shifter, a second branchline hybrid coupled to the second phase shifter, a first diplexer coupled to first outputs of the first and second branchline hybrids; and a second diplexer coupled to second outputs of the first and second branchline hybrids. In an alternative example, the combiner network comprises a first diplexer coupled to first outputs of the first and second differential phase shifters, a second diplexer coupled to second outputs of the first and second differential phase shifters, and branchline hybrid having a first input coupled to the first diplexer and a second input coupled to the second diplexer.

The feed network may further include a plurality of secondary beam tilt phase shifters, wherein the plurality of RF outputs are coupled to the plurality of secondary beam tilt phase shifters. The feed network may also further include a bypass path that provides an additional RF output that does not pass through the beamforming network.

In one aspect, the first sub-band parameter control may divide the first sub-band signal into two equal amplitude, variable phase signals which are coupled to first and second inputs of the combiner network, and the second sub-band parameter control may divide the second sub-band signal into two equal amplitude, variable phase signals which are coupled to third and fourth inputs of the combiner network. The at least one output of the combiner network may comprise a first output comprising a first portion of the first sub-band signal and a first portion of the second sub-band signal, and second output comprising a second portion of the first sub-band signal and a second portion of the second sub-band signal, where a power division of the first and second portions of the first sub-band signal is controlled by the first sub-band parameter control and a power division of the first and second portions of the second sub-band signal is controlled by the second sub-band parameter control.

In additional examples, any of the exemplary feed networks disclosed herein may be employed in an antenna, and further comprise a plurality of radiating elements coupled to the RF outputs. In one example, the sub-band parameter controls may comprise sub-band tilt controls. The array of radiating elements further comprises a plurality of sub-arrays, each sub-array being coupled to one of the plurality of RF outputs and having a plurality of radiating elements. In one example, secondary tilt devices couple the array of radiating elements to the RF outputs. In another example, at least a portion of the array of radiating elements receive a signal that bypasses the secondary tilt devices.

DETAILED DESCRIPTION

Figure 1:
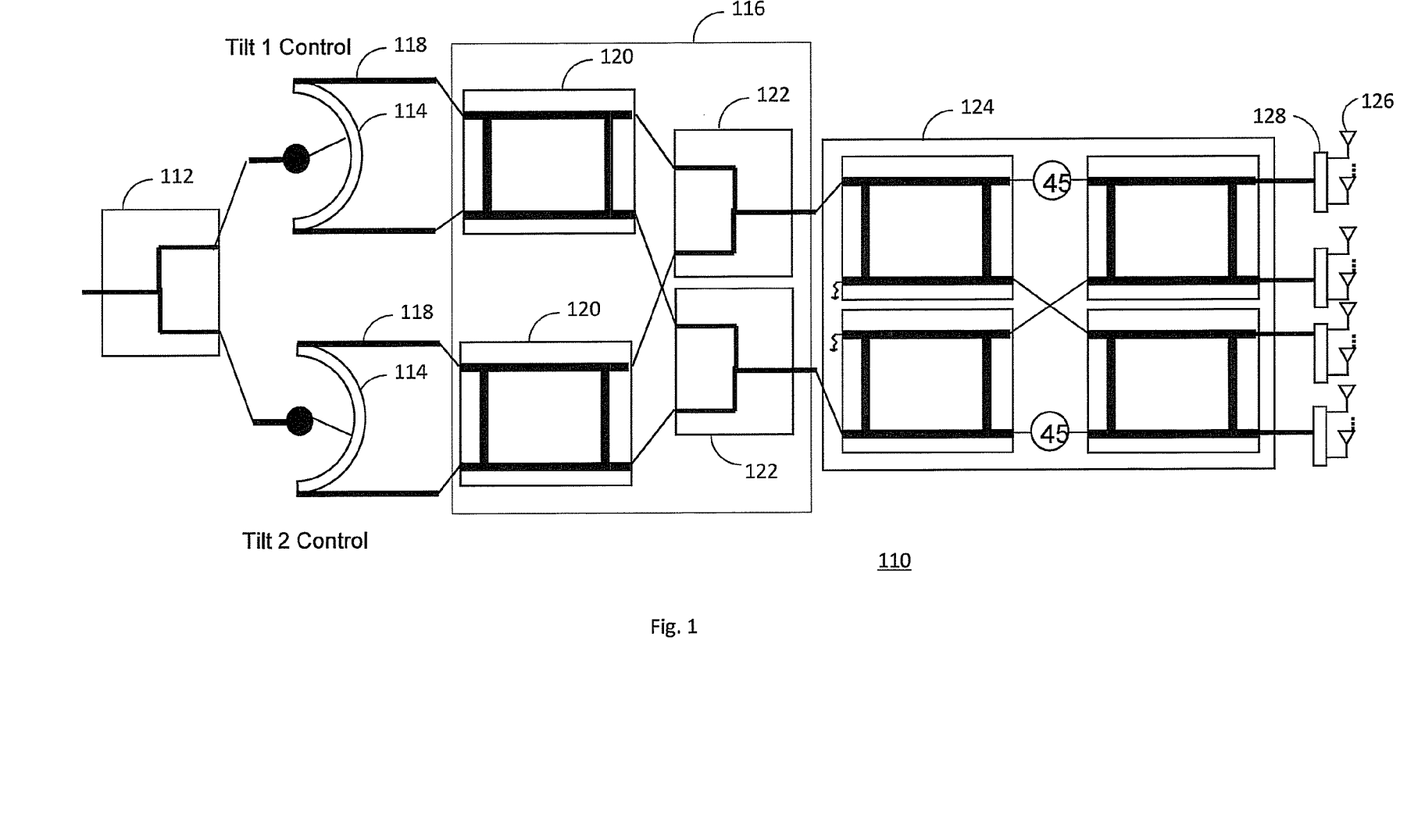
FIG. 1 illustrates a feed network and antenna array according to one example of the present invention.

Referring to FIG. 1, a beam forming network 110 according to one example of the present invention is illustrated. In this example, a composite Radio Frequency (RF) signal having a first sub-band and a second sub-band may be applied to a first diplexer 112. The first diplexer 112 splits the composite RF signal into the corresponding first sub-band and the second sub-band. The first sub-band is applied to a first tilt control 114 (Tilt 1) and the second sub-band is applied to a second tilt control 114 (Tilt 2).

In the example illustrated in FIG. 1, first tilt control 114 and second tilt control 114 each comprise a phase shifter 118. Each phase shifter 118 splits a sub-band into a pair of equal amplitude, variable phase signals. The phase shifter structure is not essential. Other structure may be used to provide equal amplitude, variable phase signals to the branchline hybrid.

The first tilt control 114 and second tilt control 114 are coupled to a combiner network 116. In the example of FIG. 1, the combiner network 116 includes first and second branch hybrids 120 and first and second diplexers 122. The equal amplitude, variable phase signals from the first and second tilt controls 114 are applied to the branchline hybrids 120, the outputs of which comprises signals that have the same phase, but variable amplitude. The outputs of the branchline hybrids 120 for the first tilt control 114 and second tilt control 114 are combined by a pair of second diplexers 122 as illustrated. A first output of each branch hybrid 120 is coupled to the first diplexer 122, and a second output of each branch hybrid 120 is coupled to the second diplexer 122. As used herein, "input" and "output" refer to the transmit signal path. However, because the structures described herein are passive components, the networks and components also perform reciprocal operations in the receive signal path. Therefore, the use of "input" and "output" is for clarity only, and is not meant to imply that the networks do not operate concurrently in both receive and transmit directions.

Because the diplexers 122 each receive a variable amplitude output from both branchline hybrids 120, the output of each diplexer 122 comprises a combination of the input sub-band signals, where the amplitude of each sub-band signal is variable dependent on the sub-band control 118. The outputs of the second diplexers 122 are applied to two of the four input ports of a beamforming network such as a Butler matrix 124, while the other two input ports are terminated in matched loads. Each output of the Butler matrix 124 may be applied to a radiating element 126, or, as illustrated in FIG. 1, a sub-array 128 of radiating elements 126. In this example, the Butler matrix 124 includes a phase delay of 45 degrees. This creates the four different phasings, in 45 degree increments, for a range of 135 degrees. Beam direction for a given sub-band may be adjusted by adjusting the power division at the inputs to the Butler matrix 124.

In this example, a downtilt of a little more than 100% of Half Power Beam Width (HPBW) may be achieved. At tilt extremes, outputs are equal amplitude. One may use more elements in outer subarrays to generate a taper and to reduce sidelobe level. At maximum and minimum tilt, the beams are well formed. At mid tilt, the superposition of the beams creates an amplitude taper resulting in a broadening of the HPBW and reduction in directivity.

While the foregoing example is illustrated with two sub-bands, additional sub-bands may be added by adding third and fourth (or additional) tilt controls, and making corresponding changes to the structure of the diplexers.

In one example the radiating elements may be dimensioned for operation over a range sufficient to accommodate adjacent RF bands, For example, radiating elements may be designed to accommodate RF signals in the range of 698-960 MHz, or RF signals in the range of 1710-2700 MHz, or even greater bands. For example, if the example of FIG. 1 was used in combination with radiating elements designed for RF signals in the range of 1710-2700 MHz, a first sub-band may be GSM 1800 signals, and a second sub-band may be UMTS 2100 signals. In another example, a first sub-band may be GSM 1800 signals, a second sub-band may be UMTS 2100 signals, and a third sub-band may be LTE 2500 signals. In each of these examples, the downtilt of each sub-band may be independently controlled, even though a common array of radiating elements is used, and a common Butler matrix is in the feed network.

Figure 2:
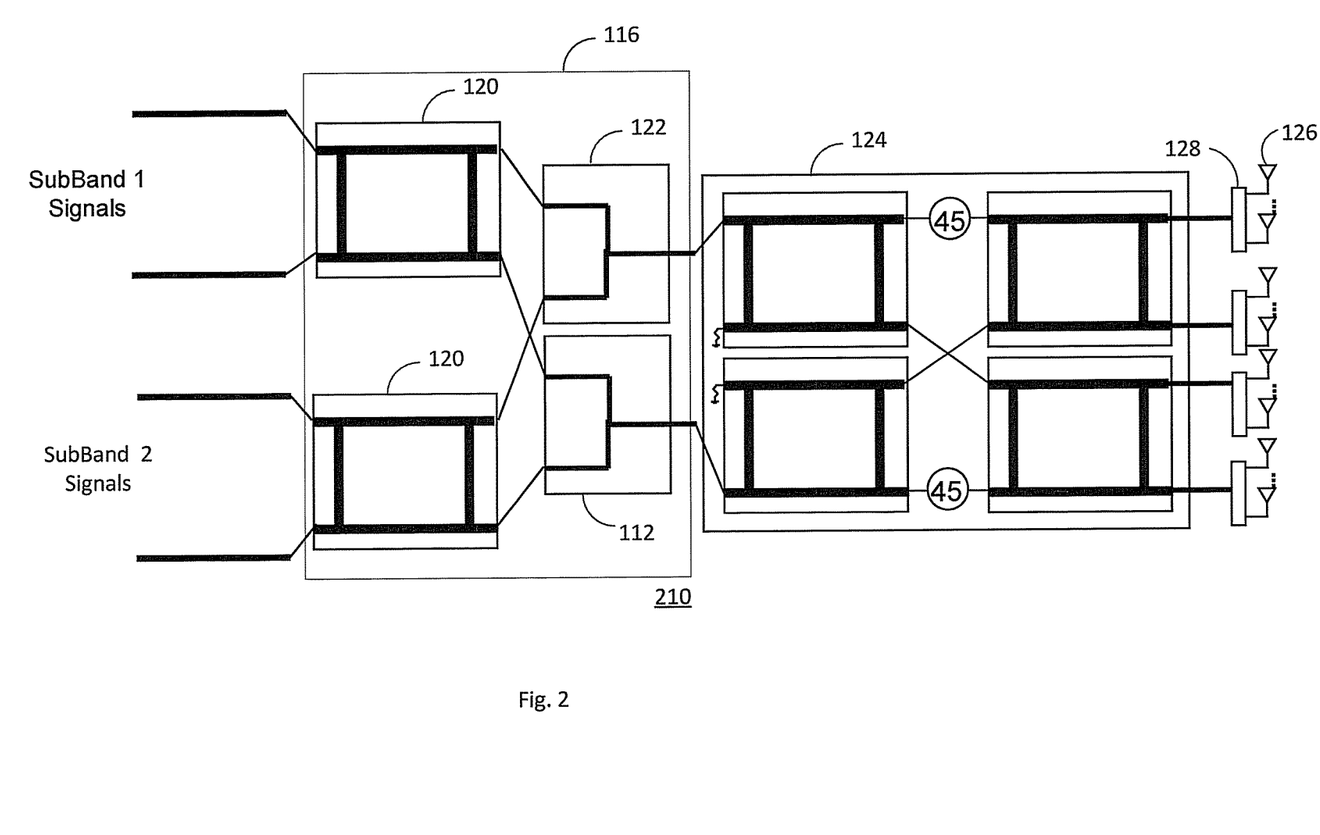
FIG. 2 illustrates a feed network and antenna array according to another example of the present invention.

Referring to FIG. 2, a beam forming network 210 according to another example of the present invention is illustrated. The example of FIG. 2 is similar to the example of FIG. 1, except that the first diplexer 124 and the phase shifters 118 are omitted. Instead, in this example, the first and second sub-band signals having phase differences are applied directly to the combiner network 116. Because feed network 210 has much in common with feed network 110, where components are arranged the same way and perform the same function, common reference characters are used in FIGS. 1 and 2, and the description of such components are not repeated.

As with the example of FIG. 1, the example of FIG. 2 may be expanded beyond two sub-bands to include multiple sub-bands.

Figure 3:
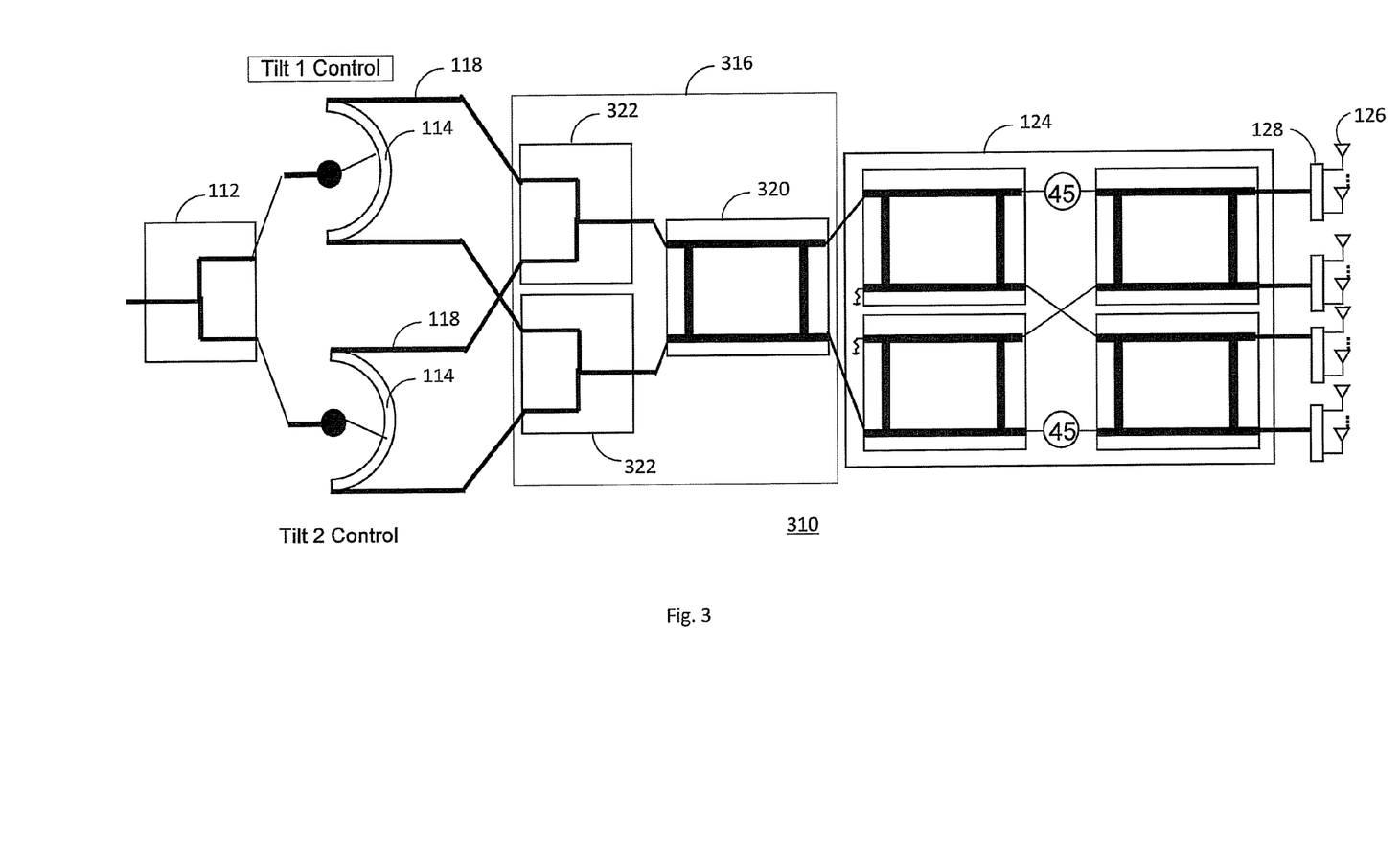
FIG. 3 illustrates a feed network and antenna array according to another example of the present invention.

Referring to FIG. 3, a beam forming network 310 according to another example of the present invention is illustrated. The example of FIG. 3 is similar to FIG. 1, with the exception that the combining network 316 is modified to reduce component count and cost. Where the components of FIG. 3 are arranged the same way and perform the same function, common reference characters are used and the descriptions of such components are not repeated. As with the example of FIG. 1, the example of FIG. 3 may be expanded beyond two sub-bands to include multiple sub-bands. Also, the alternate examples of FIGS. 2 and 3 may also be combined, e.g., use the alternate structure of FIG. 3 and omit the diplexer and phase shifters as illustrated in FIG. 2. The combining network 316 of this example includes first and second diplexers 322 connected to a single branchline hybrid 320.

In the example illustrated in FIG. 3, first tilt control 114 and second tilt control 114 each comprise a phase shifter 118. Each phase shifter 118 splits a sub-band into a pair of equal amplitude, variable phase signals. The outputs of first tilt control 114 are applied to the first inputs of a pair of diplexers 322. The outputs of second tilt control 114 are applied to the second inputs of a pair of diplexers 322. The outputs of the diplexers comprise both sub-bands having a phase variable with the tilt controls, and equal amplitudes. The outputs of the diplexers 322 are applied to the inputs of a branchline hybrid 320. The outputs of the branchline hybrid comprise both sub-band signals, with equal phase and variable amplitude. The outputs of the branchline hybrid 320 are applied to two of the four input ports of a Butler matrix 124, while the other two input ports are terminated in matched loads. Once again, tilt of a sub-band may be controlled by varying the power division of a given sub-band across the inputs of the Butler matrix 124.

Figure 4:
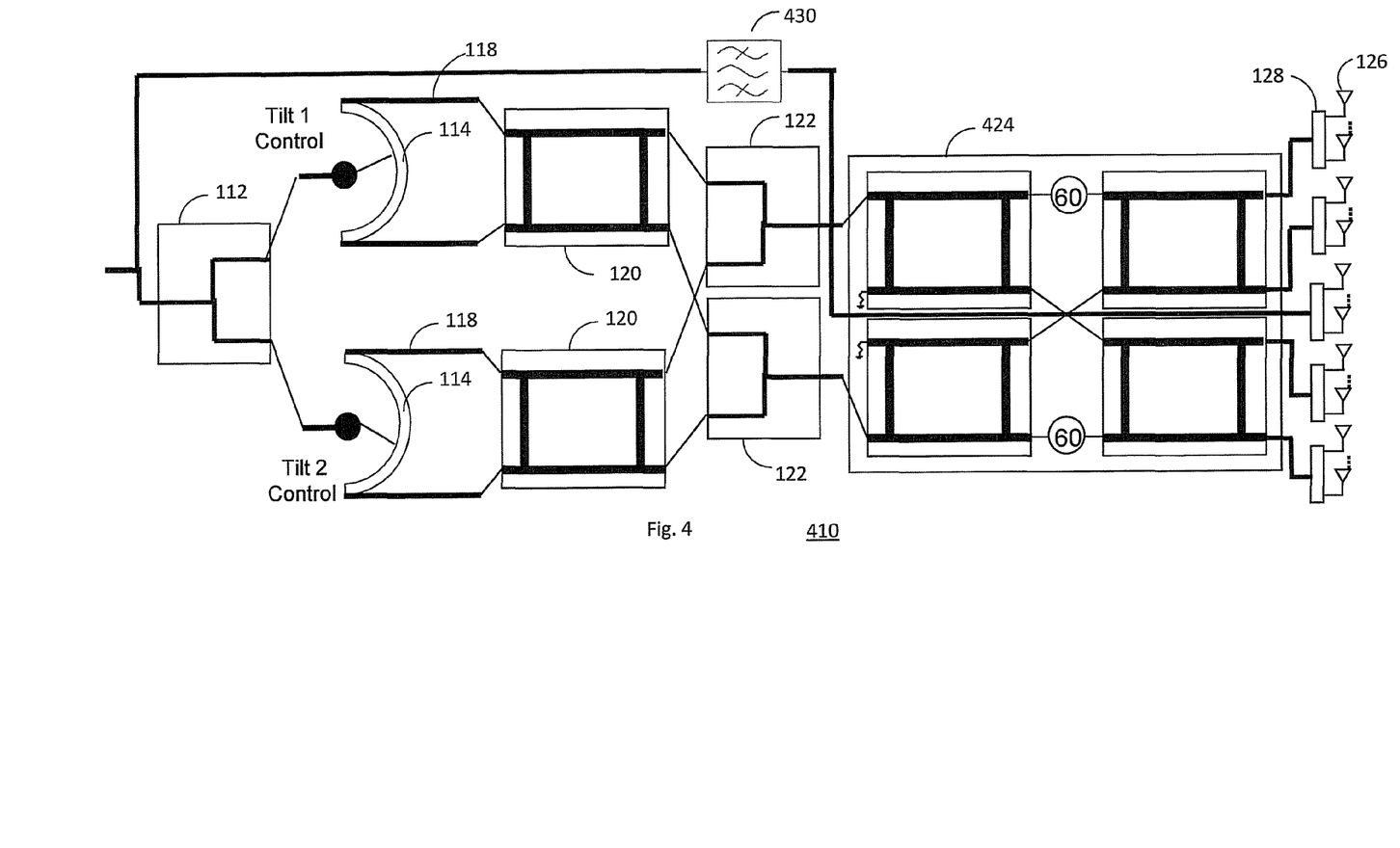
FIG. 4 illustrates a feed network and antenna array according to another example of the present invention.

Another example of the invention is illustrated in FIG. 4. This example is similar to the example of FIG. 1, but adds another sub-array 128 of radiating elements 126 in the middle of the array of radiating elements. Because the feed network 410 of FIG. 4 has much in common with feed network 110, where components are arranged the same and perform the same function, common reference characters are used in FIGS. 1 and 4, and the descriptions of unchanged components are not repeated, but instead the description of FIG. 1 is incorporated by reference. For purposes of clarity of illustration, box and reference character for the combining network 116, are omitted, although the constituent components of the combining network 116 are illustrated with branchline hybrids 120 and diplexers 122.

This additional sub-array 128 is driven by an RF signal that does not experience any variability regarding phase shift because it does not pass through the rest of the beam forming network 410. Instead, the signal goes through a fixed phase delay element 430, such as a band-pass filter. The fixed phase delay element 430 may be selected to achieve an appropriate amount of fixed phase delay so that the sub-array 128 that is physically in the center of the antenna array also remains in the middle as far as phase shift is considered. Also, two additional diplexers (not illustrated) may be used in the "pass through" signal path to build in sufficient fixed phase delay.

With the expansion of the number of sub-arrays (or individual radiating elements), it may be desirable to reconfigure the phase increments between the radiating elements of sub arrays of radiating elements. For example, in FIG. 4, the Butler matrix 424 is modified such that the phase delay is 60 degrees. In this example, there are five phased outputs with a maximum 30 degree increment. This reduces the downtilt range slightly (e.g., a 10 element array may scan 6 degrees, as opposed to 6.5 degrees for the examples of FIGS. 1-3). However, degradation of the beam pattern at mid-tilt is reduced, and side lobe suppression may be improved.

As with the example of FIG. 1, the example of FIG. 4 may be expanded beyond two sub-bands to include multiple sub-bands. Also, the alternate examples of FIGS. 2 and 3 may also be combined with the example of FIG. 4, e.g., use the alternate combining network 316 structure of FIG. 3 and omit the diplexer and phase shifters as illustrated in FIG. 2.

Figure 5:
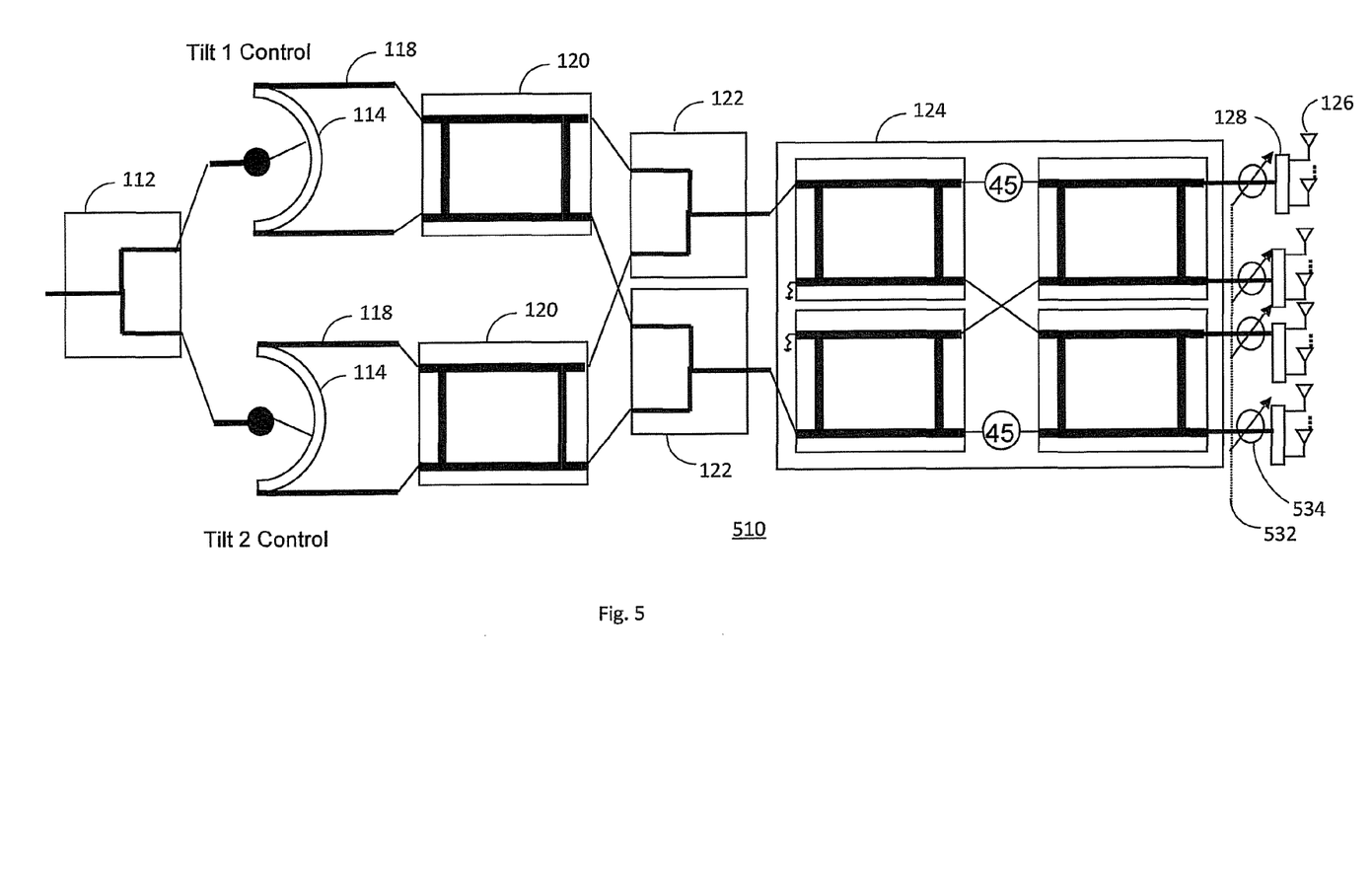
FIG. 5 illustrates a feed network and antenna array according to another example of the present invention.

Another example is illustrated in FIG. 5. This example includes the structure of the FIG. 1 example, with the inclusion of a secondary phase shifters 532 between the output of the Butler matrix and the radiating elements (or sub-arrays of radiating elements). Because the feed network 510 of FIG. 5 has much in common with feed network 110, where components are arranged the same way and perform the same function, common reference characters are used in FIGS. 1 and 5, and the descriptions of such components are not repeated, but instead the description of FIG. 1 is incorporated by reference. The secondary phase shifters 532 may also be combined with any of the foregoing examples.

The location of the secondary phase shifters means 532 that they operate on all of the sub-bands being transmitted or received with equal effect. However, Tilt 1 control and Tilt 2 control still allow independent control of sub-bands. In this example, the secondary phase shifters may have a range of 0-8 degrees. Tilt 1 control and Tilt 2 control may have an adjustment range of 6 degrees, e.g., +/−3 degrees. If the secondary phase shifter is set at 4 degrees, then Tilt 1 and Tilt 2 may be independently set anywhere between 1 and 7 degrees (4−3 and 4+3 degrees, respectively). Continuing this example, if Tilt 1 is set at 2 degrees, the first sub-band would have a total tilt of 6 degrees. If Tilt 2 is set at −1 degree, then the second sub-band would have a total tilt of 3 degrees. In this example, the secondary phase shifters may be adjusted independently of Tilt 1 and Tilt 2, and may be adjusted dynamically, even if Tilt 1 and Tilt 2 are left unchanged for longer periods of time.

Figure 6:
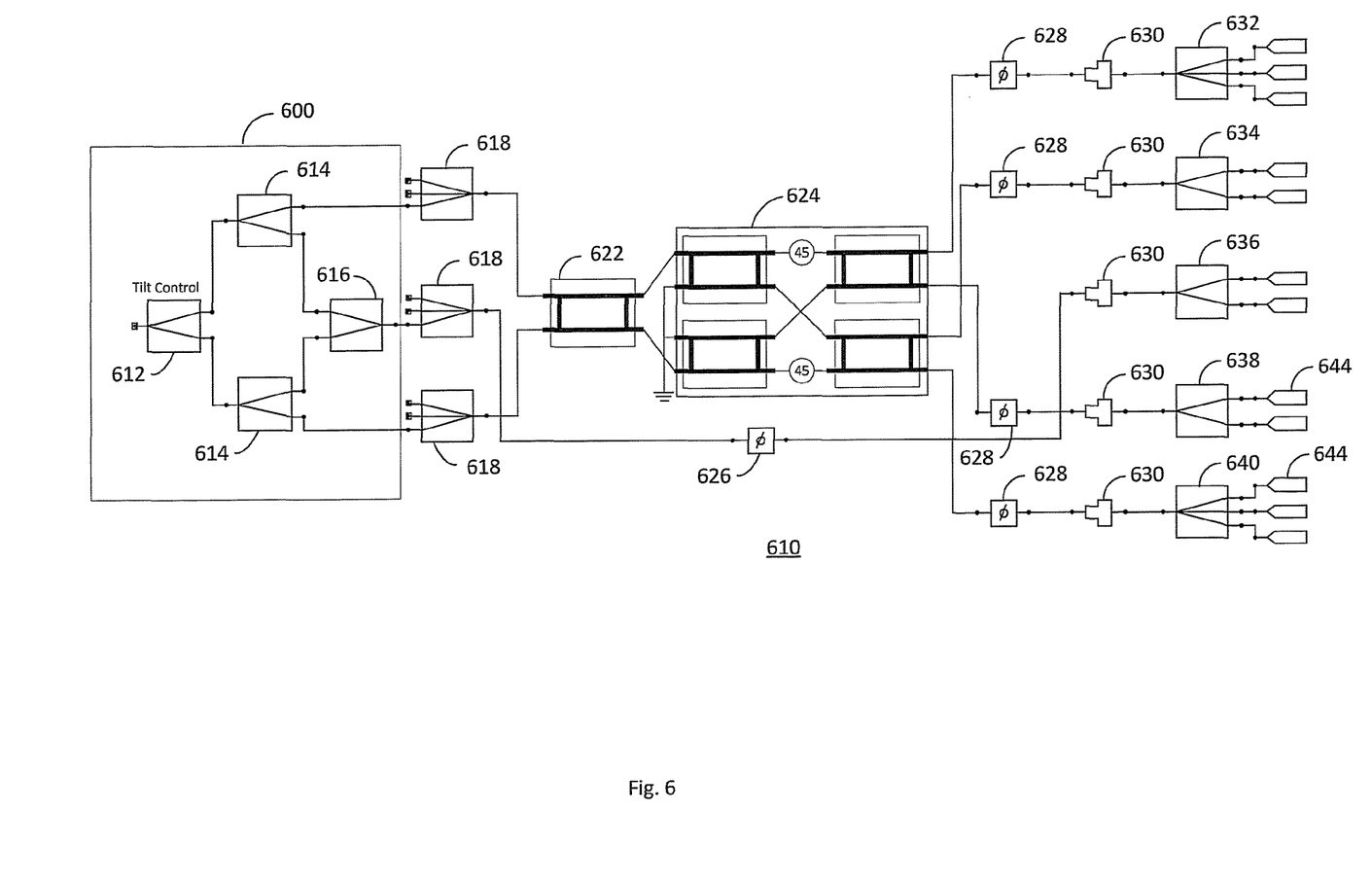
FIG. 6 illustrates a feed network and antenna array according to another example of the present invention.

Referring to FIG. 6, another example is presented having five output ports as part of a feed network 610. For clarity, a single sub-band network 600 is illustrated. In this example, the sub-band network 600 provides three equal amplitude, variable phase signals to three combiners 618 (three port diplexers). The three port combiners 618 in this example enable the use of the antenna array by three sub-bands. For each sub-band, two of the signals may be phase-shifted to achieve tilt control, while the third may be configured so as to not experience any variability in phase delay.

In this example, sub band network 600 includes tilt control 612, first and second pre-feedboards 614, and Extra PS 616. As in examples above, two equal amplitude, variable phase signals are provided by tilt control 612. The two signals from tilt control are coupled to the pre-feedboards 614. The pre-feedboards 614 may be 1:2 power dividers. One output of each pre-feedboard 614 is provided to Extra PS 616. The "Extra PS" is a preferably isolated 2:1 power combiner. In one example, Extra PS 616 may be a reversed 1:2 phase shifter, similar to structure that may be used for tilt control 612. This potentially allows the combination of the two signal portions in phase so that there is no signal loss. This requires that the phase offset of the Extra PS 616 be set so that it cancels out the phase difference between the two original signals output by tilt control 612. In one example, the phase offset of the initial device to the antenna control may be communicated so that the Extra PS 616 can be set correctly, such as by using an actuator or other means to adjust the Extra PS 616 once the correct value is known.

In another example, Extra PS 616 may be an isolated combiner, such as a Wilkinson combiner. A disadvantage of this example is that when the two inputs to Extra PS 616 are not in phase, some of the power will be lost in the vectoral combination.

In this example, the combining network includes 3 three port combiners 618 and a branchline hybrid 622. The output of Extra PS 616 and the other outputs of pre-feed boards 614 are input to the three port combiners 618. In the illustration of FIG. 6, each three port combiner 618 shows two inputs without connections. In practice, these inputs would be connected to additional sub-band networks. The present invention is not limited to a three port combiner, and fewer or greater numbers of sub-bands may be combined with diplexers having fewer or greater numbers of input ports.

In the example of FIG. 6, two of the combined variable phase signals are coupled to a branchline hybrid 622. The branchline hybrid 622 is coupled to the inputs of the Butler matrix 624. The Butler matrix 624 provides four variable phase, equal amplitude outputs. The third of the combined variable phase signals does not experience any additional variability regarding phase shift because it does not pass through the branchline hybrid 622 or the Butler matrix 624. Instead, the third signal goes through a circuit element 626 which may be selected to achieve an appropriate amount of fixed phase delay so that the phase shift is in the middle of the outputs of the Butler matrix 624. With the inclusion of the non-variable center sub-array, there are there are five phased outputs. As in the example of FIG. 4, the Butler matrix 624 may be modified such that the phase delay is selected to take advantage of the additional sub-array in the middle of the array.

The example of FIG. 6 also includes secondary phase shifters 628 coupled to the output of the Butler matrix 624 and the radiating elements (or sub-arrays of radiating elements). The location of the secondary phase shifters means that they operate on all of the sub-bands being transmitted or received with equal effect. However, the sub-array tilt control 612 still allows independent control of sub-bands.

Also illustrated in FIG. 6 are azimuth beam forming elements 630 and a plurality of sub-arrays 632, 634, 636, 638, and 640. Sub-arrays 632 and 640 comprise a 1:3 splitter 642 and three radiating elements. Sub-arrays 634, 636 and 638 comprise 1:2 splitters 646 and two radiating elements 644. Center sub-array 636 is coupled to the fixed phase delay signal that did not pass through beam forming network 626. Other combinations of radiating elements and sub-arrays are contemplated.

Figure 7:
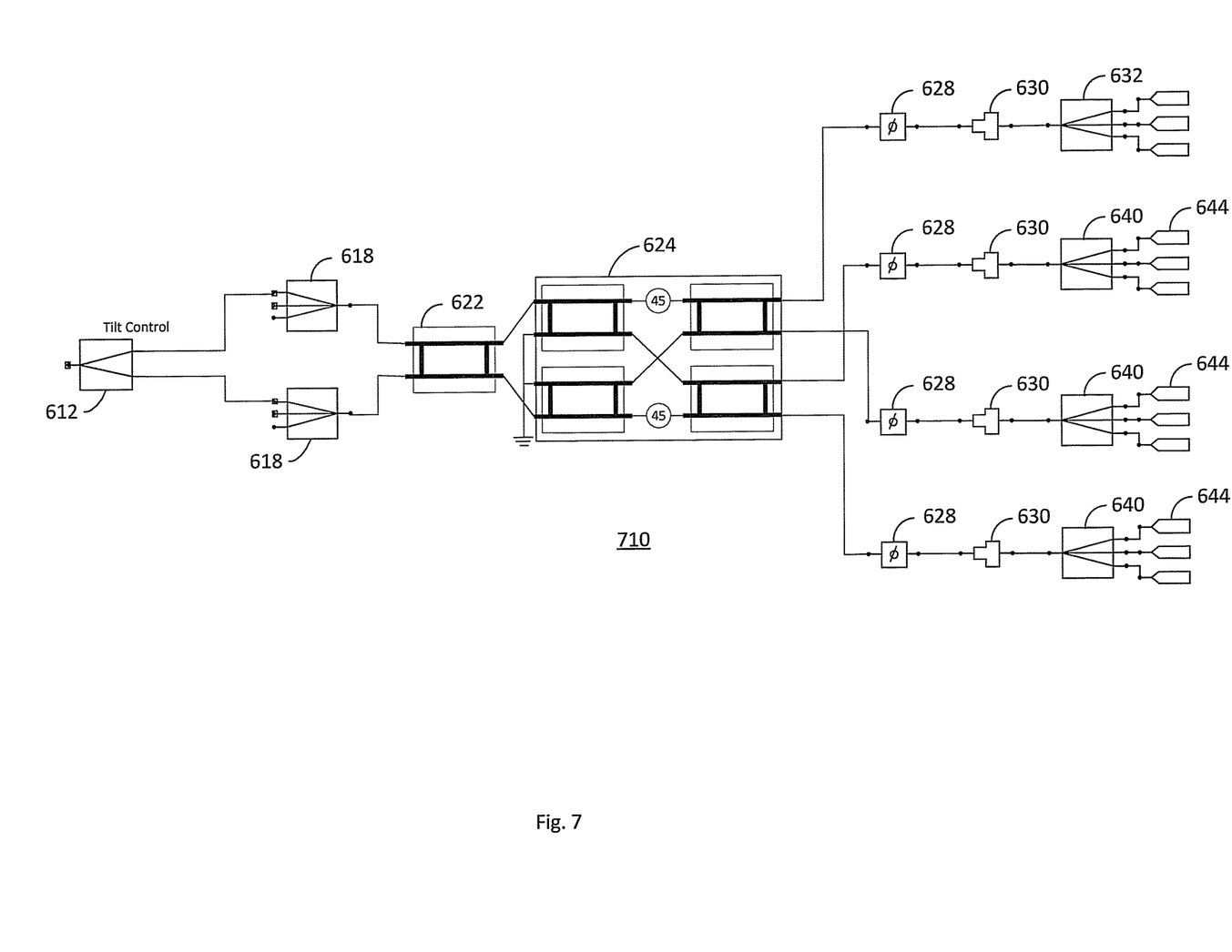
FIG. 7 illustrates a feed network and antenna array according to another example of the present invention.

Referring to FIG. 7, another example of a feed network 710 having four output ports is presented. For clarity, a single sub-band network 600 is illustrated. The sub-band network and beam forming network 624 of FIG. 7 is similar in many ways to that of FIG. 6, with the omission of the Extra PS 616 and phase delay 626 providing a fixed phase signal. Accordingly, there are four output ports and four sub-arrays in the feed network 710. Components that have been described with respect to FIG. 6 retain the same reference characters and the descriptions of such components are not repeated herein.

Figure 8:
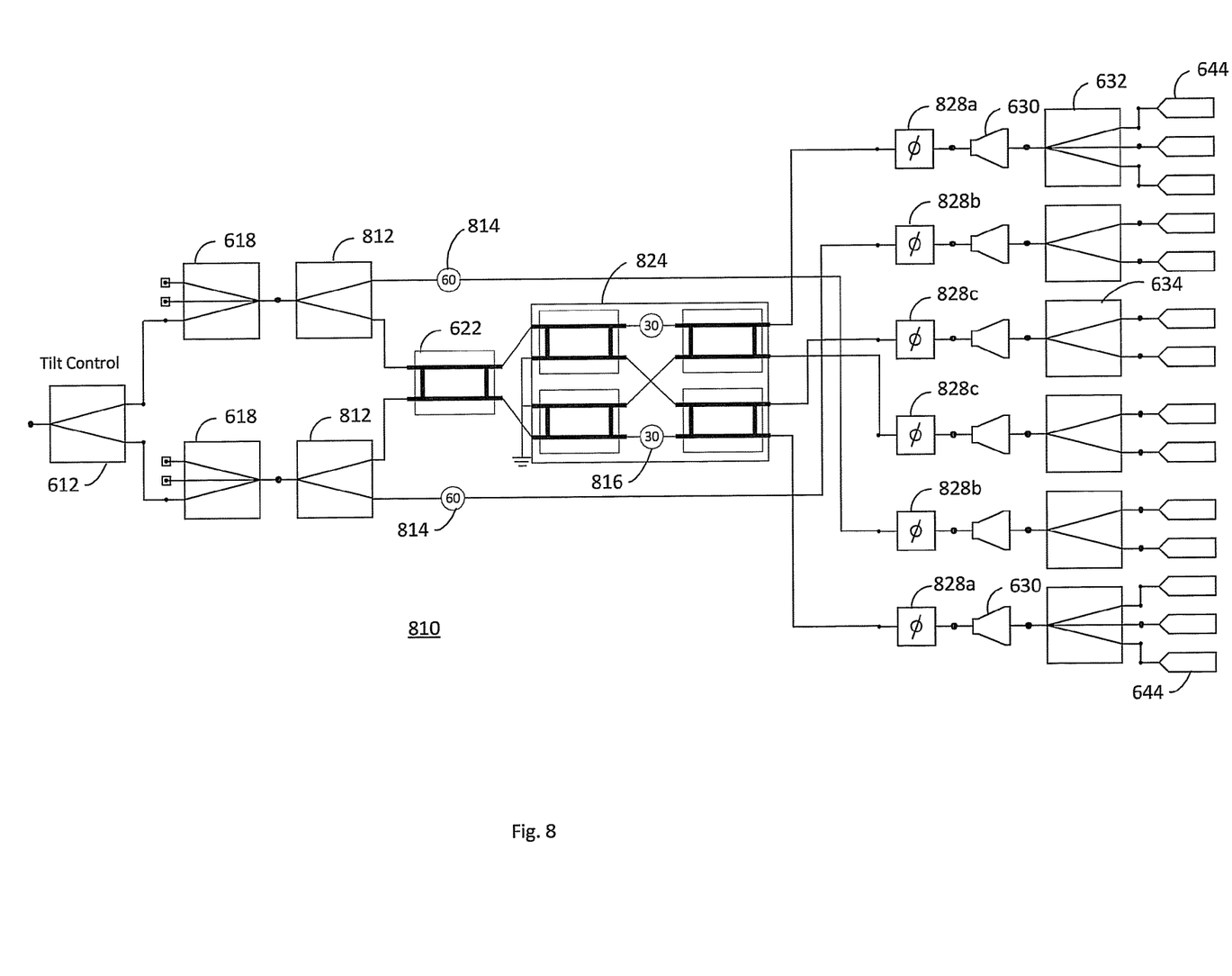
FIG. 8 illustrates a feed network and antenna array according to another example of the present invention.

In the example of FIG. 8, a feed network 810 providing a six port solution is illustrated having 14 radiating elements 644. For clarity, a single sub-band network 600 is illustrated. Components that have been described with respect to FIG. 6 retain the same reference characters and the descriptions of such components are not repeated herein.

The example of FIG. 8 includes a beam forming network that includes two pre-feedboards, a branchline hybrid, and a Butler matrix. Each pre-feedboard comprises a 1:2 power divider 812, which may be of any known construction. In this example, the power divider 812 may be configured to divide the power to two outputs, one at two-thirds of the input power, and one at one third of the input power. Other power division ratios are contemplated. The two-third power level output of each power divider is coupled to the branchline hybrid. The one-third power level output of each power divider is coupled to a fixed phase offset circuit. In the illustrated example, the fixed phase offset 814 is 60 degrees. The Butler matrix is modified such that the phase offset circuit 816 is 30 degrees. The four outputs of the Butler matrix, in combination with the two outputs that are coupled through the fixed phase offset circuits, provide a six port solution.

The example of FIG. 8 also includes secondary phase shifters 828a, 828b, and 828c coupled to the output of the Butler matrix and the sub-arrays of radiating elements. To achieve a progressive phase shift, phase shifters 828, 828b and 828c have a predetermined relationship to each other, with phase shifter 828a providing more phase shift than phase shifter 828b, which, in turn, applies more phase shift than phase shifter 828c. In this example, the top and bottom sub-arrays comprise three radiating element, and the middle four sub-arrays comprise two radiating elements. This example includes 14 radiating elements 644. The radiating elements may be evenly spaced at 100 mm.

Figure 9:
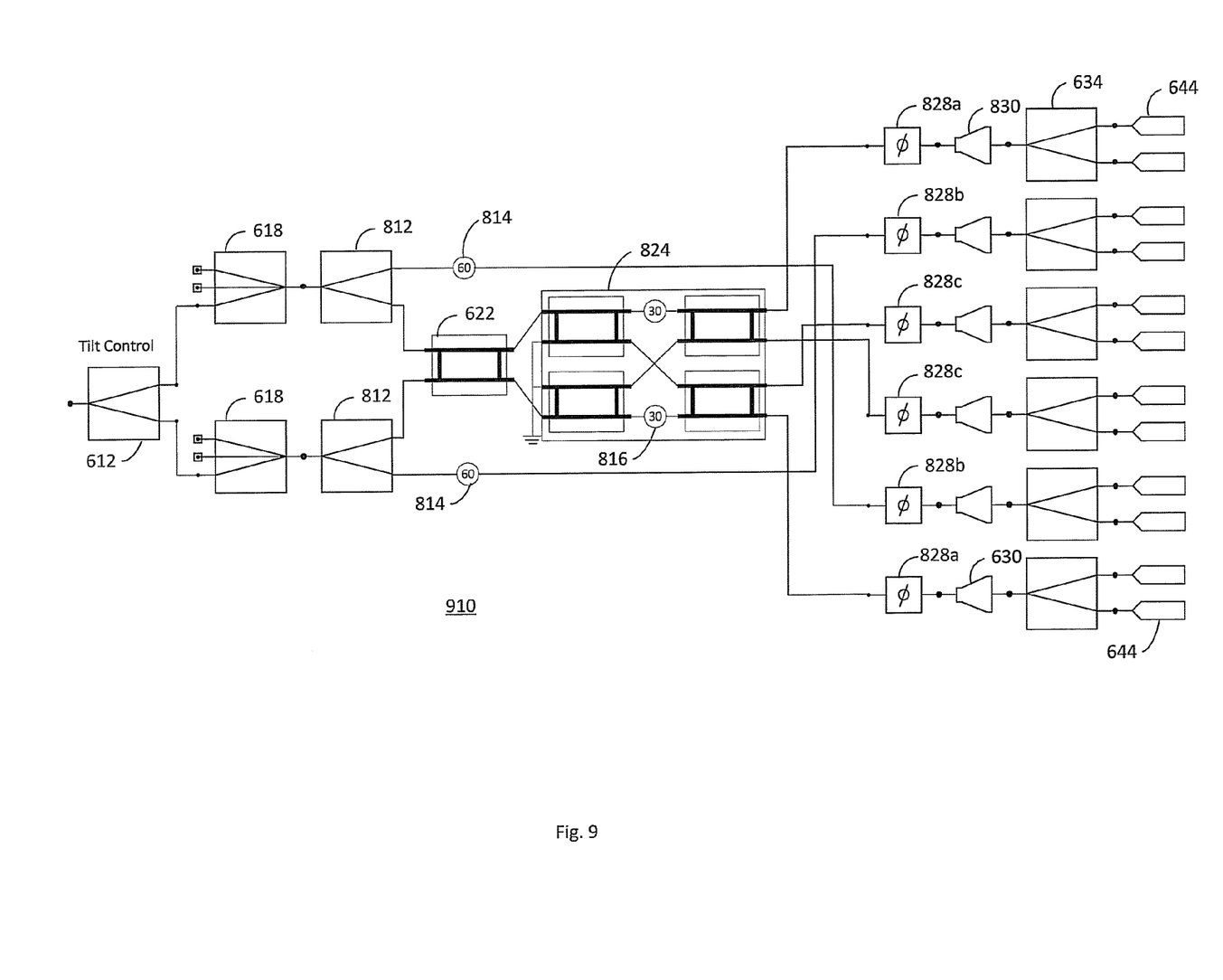
FIG. 9 illustrates a feed network and antenna array according to another example of the present invention.

FIG. 9 illustrates feed network 910, which is an example that is similar to the example of FIG. 8, with the change that the top and bottom sub-arrays are two element arrays. This results in twelve radiating elements. In one example, twelve radiating elements may be evenly spaced at 105 mm. In another example, the twelve radiating elements are not evenly spaced. For example, the spacing may be 118 mm/111 mm/104 mm/100 mm/97 mm/95 mm/97 mm/100 mm/104 mm/111 mm/118 mm. That is, the elements are spaced closer together toward the middle, and spaced further apart at the ends. Other examples of arrays of radiating elements in this disclosure may also benefit from non-even spacing.

Figure 10:
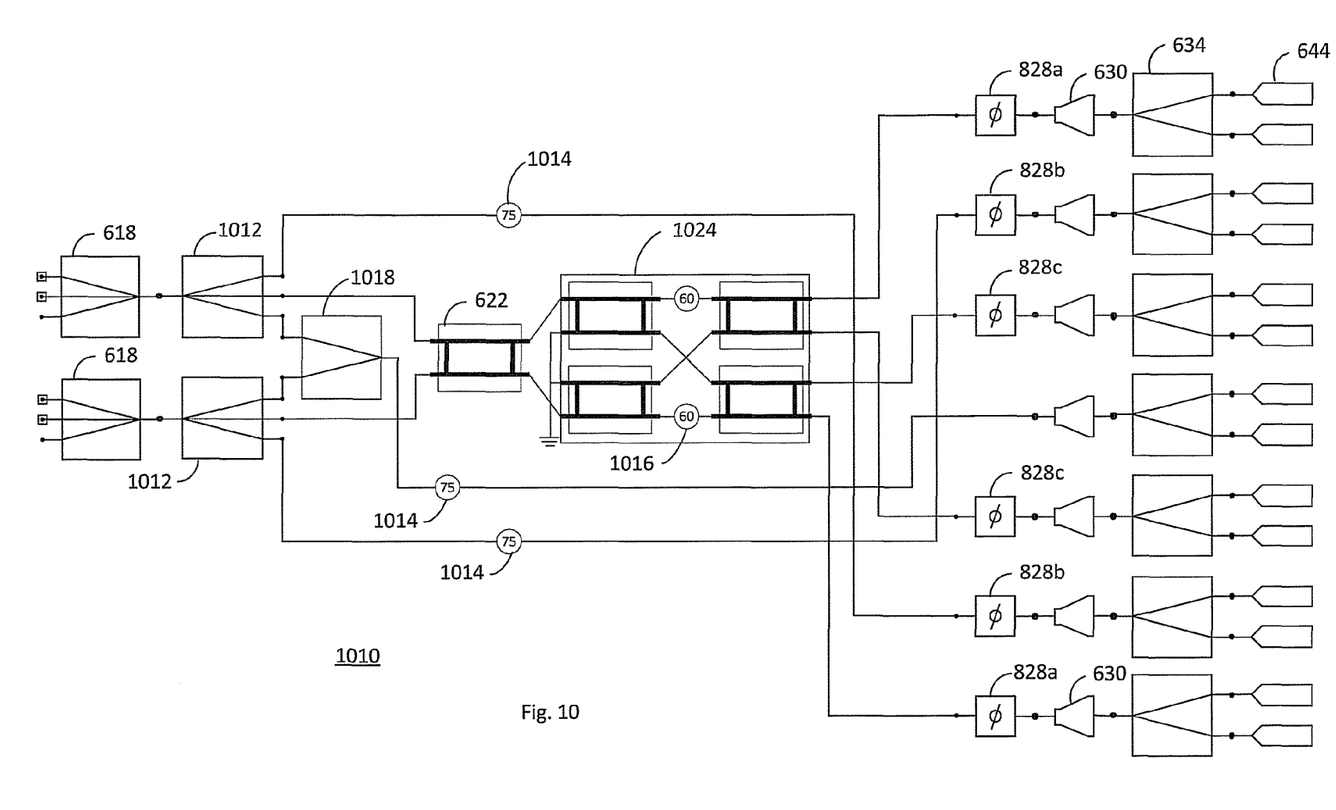
FIG. 10 illustrates a feed network and antenna array according to another example of the present invention.

In the example of FIG. 10, a feed network 1010 comprises a seven port solution. Components that have been described with respect to FIG. 6 and/or FIG. 8 retain the same reference characters and the descriptions of such components are not repeated herein. For purposes of clarity, the sub band networks are not illustrated. As with prior examples, the three port combiners 618 may each be connected to three sub band networks. Additionally, combiners with greater or fewer than three ports may be used to connect to greater or fewer than three sub band networks.

Each three port combiner is coupled to a 1:3 pre-feed board 1012. A first output of each pre-feed board 1012 is coupled to a fixed phase delay of 75 degrees. This portion comprises the second and sixth ports of the seven ports provided by the feed network 1010. A second output of each pre-feed board 1012 is coupled to a pre-feed board 1018, which is then coupled to a phase delay element of 75 degrees. Alternatively, a phase shifter may be used in place of pre-feed board 1018. This portion comprises the middle (fourth) port of the feed network 1010.

The third outputs of the pre-feed boards 1018 are coupled to branchline hybrid 622. Branchline hybrid 622 is coupled to Butler matrix 1024. The phase delay elements 1016 of Butler matrix 1024 are configured to be 60 degrees to account for the extra ports of the feed network. The outputs of the Butler matrix 1024 comprise the first, third, fifth and seventh ports of the feed network 1010.

The feed network 1010 also includes secondary phase shifters 828a, 828b and 828c to provide tilt control common to all sub bands. The phase relationships between the phase shifters 828a, 828b and 828c may be adjusted to account for the addition of the center (fourth) port.

The foregoing embodiments are intended to be exemplary embodiments and are not intended to be limit the present invention, the scope of which is defined by the claims.

What is claimed is:

1. A feed network for use with an antenna array, comprising:
   a. a first RF input for a first sub-band signal coupled to a first sub-band parameter control;
   b. a second RF input for a second sub-band signal coupled to a second sub-band parameter control;

c. a combiner network having a first diplexer coupled to first outputs of the first and second sub-band parameter controls and a second diplexer coupled to second outputs of the first and second sub-band parameter controls, the combiner network also having a branchline hybrid having a first input coupled to the first sub-band parameter control and a second input coupled to the second sub-band parameter control, the combiner network also having at least one output comprising a combination of the first sub-band signal and the second sub-band signal; and d. a beamforming network, the beamforming network coupled to outputs of the branchline hybrid of the combiner network and having a plurality of RF outputs;

wherein the first and second sub-band parameter controls are independently adjustable and wherein adjustment of the first and second sub-band parameter controls independently adjusts a down-tilt of first and second sub-band beams.

2. The feed network of claim 1, wherein the first sub-band parameter control comprises a first differential phase shifter and the second sub-band parameter control comprises a second differential phase shifter.

3. The feed network of claim 2, wherein adjusting the first differential phase shifter results in the first RF sub-band to have a first set of phase relationships on the plurality of RF outputs, and wherein adjusting the second differential phase shifter results in the second RF sub-band to have a second set of phase relationships on the plurality of RF outputs.

4. The feed network of claim 1, further comprising a plurality of secondary beam tilt phase shifters, wherein the plurality of RF outputs are coupled to the plurality of secondary beam tilt phase shifters.

5. The feed network of claim 1, further comprising at least one bypass path that provides at least one additional RF output that does not pass through the beamforming network.

6. The feed network of claim 1, wherein the first sub-band parameter control divides the first sub-band signal into two equal amplitude, variable phase signals which are coupled to first and second inputs of the combiner network, and the second sub-band parameter control divides the second sub-band signal into two equal amplitude, variable phase signals which are coupled to third and fourth inputs of the combiner network.

7. The feed network of claim 6, wherein the at least one output of the combiner network comprises a first output comprising a first portion of the first sub-band signal and a first portion of the second sub-band signal, and second output comprising a second portion of the first sub-band signal and a second portion of the second sub-band signal, wherein a power division of the first and second portions of the first sub-band signal is controlled by the first sub-band parameter control and a power division of the first and second portions of the second sub-band signal is controlled by the second sub-band parameter control.

8. The feed network of claim 7, wherein the beamforming network comprises a Butler matrix.

9. The feed network of claim 1, further comprising a third RF input for a third sub-band signal coupled to a third sub-band parameter control, wherein the combiner network is further coupled to the third sub-band parameter control and the at least one output of the combiner network further comprises a combination of the first, second and third sub-band signals.

10. An antenna, comprising:
a. a feed network, having:
1. a first RF input for a first sub-band coupled to a first sub-band tilt control;
2. a second RF input for a second sub-band coupled to a second sub-band tilt control, the second sub-band tilt control being controllable independently with respect to the first sub-band tilt control;
3. a combiner network having a first branchline hybrid coupled to the first sub-band tilt control and a second branchline hybrid coupled to the second sub-band tilt control, the combiner network including a first diplexer coupled to first outputs of the first and second branchline hybrids and a second diplexer coupled to second outputs of the first and second branchline hybrids, the combiner network also having at least one output comprising a combination of the first sub-band signal and the second sub-band signal; and
4. a beamforming network, the beamforming network coupled to at least one output of the first and second diplexers of the combiner network and having a plurality of RF outputs; and b. an array of radiating elements, the radiating elements being coupled to the RF outputs.

11. The antenna of claim 10, wherein the array of radiating elements further comprises a plurality of sub-arrays, each sub-array being coupled to one of the plurality of RF outputs and having a plurality of radiating elements.

12. The antenna of claim 10, wherein secondary tilt devices couple the array of radiating elements to the RF outputs.

13. The antenna of claim 12, wherein at least a portion of the array of radiating elements receive a signal that bypasses the secondary tilt devices.

14. The antenna of claim 12, wherein the at least one output of the combiner network comprises a first output comprising a first portion of the first sub-band signal and a first portion of the second sub-band signal, and second output comprising a second portion of the first sub-band signal and a second portion of the second sub-band signal, wherein a power division of the first and second portions of the first sub-band signal is controlled by the first sub-band tilt control and a power division of the first and second portions of the second sub-band signal is controlled by the second sub-band tilt control.

15. The antenna of claim 14, wherein the beamforming network comprises a Butler matrix.

16. The antenna of claim 10 further comprises at least one bypass path configured to provide an additional RF output that passes through a fixed phase delay element but does not pass through the combiner network and the beamforming network.

17. The antenna of claim 10 further comprises at least one bypass path configured to provide at least one additional RF output that does not pass through the beamforming network.

* * * * *